United States Patent [19]
Nuber et al.

[11] Patent Number: 6,118,169
[45] Date of Patent: Sep. 12, 2000

[54] METHOD FOR INCREASING POWER SUPPLY BYPASSING WHILE DECREASING CHIP LAYER DENSITY VARIATIONS

[75] Inventors: Paul D Nuber; Dan Stotz; M. Jason Welch; Stephen E. Clarke; Guy H. Humphrey; C. Stephen Dondale, all of Ft. Collins, Colo.

[73] Assignee: Agilent Technologies, Palo Alto, Calif.

[21] Appl. No.: 09/204,021

[22] Filed: Dec. 1, 1998

[51] Int. Cl.[7] .................................................. H01L 27/118
[52] U.S. Cl. ............................................ 257/532; 257/532
[58] Field of Search .................................. 257/532–543, 257/202–211

[56] References Cited

U.S. PATENT DOCUMENTS 5,523,611   6/1996   Mischel et al. ...................... 257/461

*Primary Examiner*—David Hardy

[57] ABSTRACT

A method for increasing the layer density uniformity across a conductive layer, which comprises a plurality of functional blocks, of an integrated circuit is presented. Increased uniformity is achieved by tiling a plurality of capacitors in between the functional blocks. The configuration of the capacitor array and number of the capacitor cells in the array is arranged so as to provide approximate uniformity in the conductor-to-non-conductor density across the entire conductive layer. The capacitor array may be used to reduce power supply switching noise by coupling one or more of the capacitor cells making up the capacitor array between a high power rail and a low power rail.

4 Claims, 5 Drawing Sheets

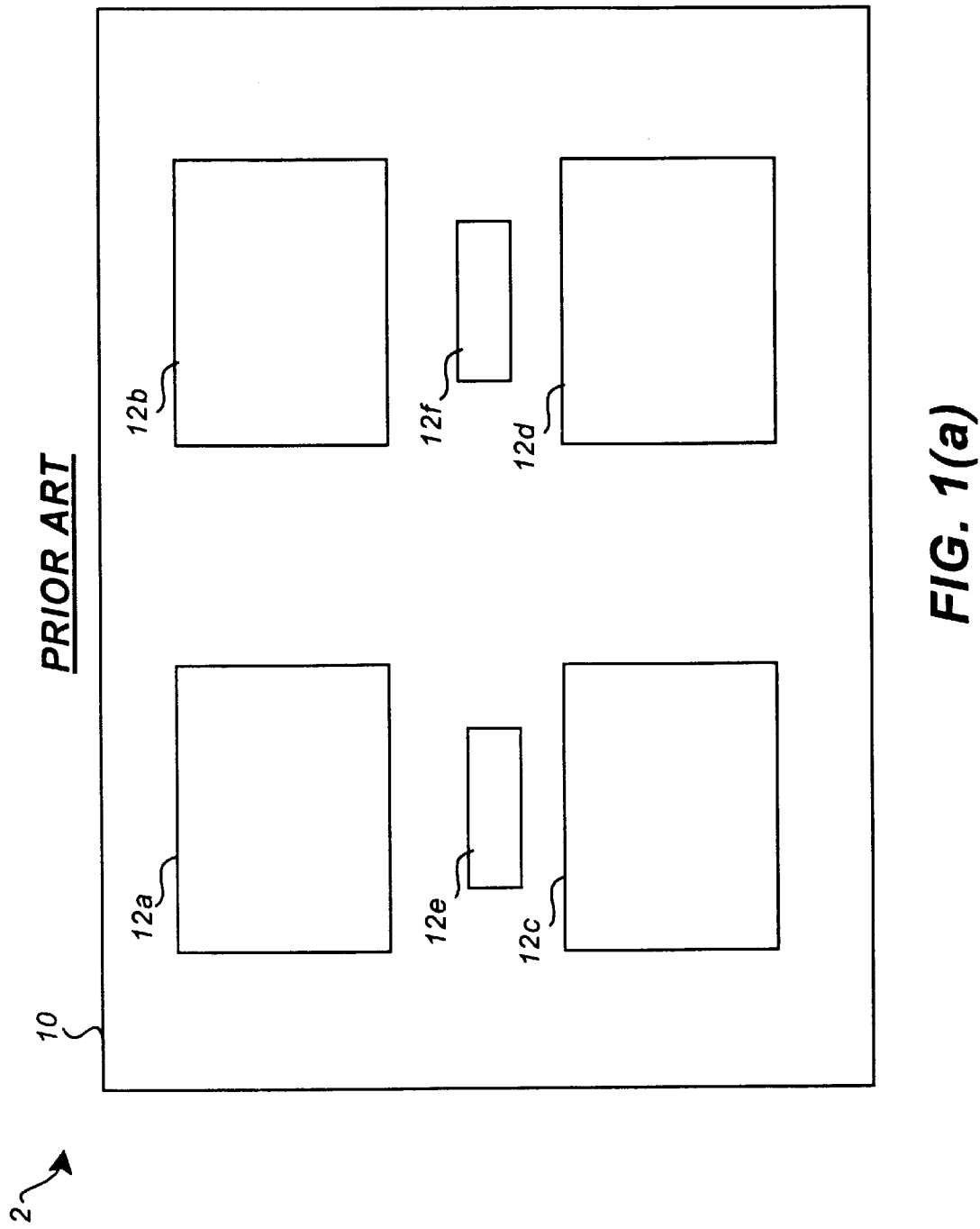

PRIOR ART

METHOD FOR INCREASING POWER SUPPLY BYPASSING WHILE DECREASING CHIP LAYER DENSITY VARIATIONS

FIELD OF THE INVENTION

The present invention pertains generally to integrated circuit design and fabrication, and more particularly to a method for increasing power supply bypassing while decreasing chip layer density variations.

BACKGROUND OF THE INVENTION

The semiconductor industry continues to yield integrated circuits (ICs) of increasing density in order to reduce their overall required chip space. An IC comprises a plurality of conductive layers stacked one on top of another between dielectric insulators on a substrate. For ease of design and debugging, a common fabrication method is to implement the functional portions of the chip in separate blocks. Because each functional block may not be identical, this method typically results in conductive layer density variations between blocks. Furthermore, typical layouts include empty space between functional blocks. Accordingly, the density variations between different areas on a conductive layer may vary widely.

With new fabrication technologies such as chemical mechanical polishing, the functional block approach to chip design is problematic. Chemical mechanical polishing is a method used for planarizing a semiconductor wafer. The chemical mechanical polishing method rotates a polishing platen coated with a slurry solution at a constant speed over the surface of a semiconductor wafer in order to provide uniform thickness. However, when the chip layer being polished is not uniform in density, the conductive material in low density areas is eroded more quickly than the material in high density areas. For example, the metal lines at the edges of a functional block that reside adjacent to one of the empty spaces between functional blocks are polished down more quickly than metal lines that that are surrounded by other metal lines in close proximity, resulting in non-uniform metal thickness across a given chip layer.

Accordingly, a need exists for a method for increasing conductive layer density uniformity without requiring a drastic change in design or manufacturing process methodology.

SUMMARY OF THE INVENTION

The present invention is a novel method and system for increasing conductive layer density uniformity for semiconductor wafers. The method of the invention allows the functional block approach to chip design to be maintained while overcoming the problem of non-uniformity in layer thickness.

In accordance with the invention, increased uniformity is achieved by tiling a capacitor array comprising a plurality of capacitors in between the functional blocks on a conductive layer. The configuration of the capacitor array and number of the capacitor cells in the array is arranged so as to provide approximate uniformity in the metal-to-non-metal density across the entire conductive layer. The capacitor array may be used to reduce power supply switching noise by coupling one or more of the capacitor cells making up the capacitor array between a high power rail and a low power rail.

BRIEF DESCRIPTION OF THE DRAWING

The invention will be better understood from a reading of the following detailed description taken in conjunction with the drawing in which like reference designators are used to designate like elements, and in which:

FIG. 1(*b*) is a side view of the integrated circuit of FIG. 1(*a*);

FIG. 1(*c*) is a side view of the conductive layer of the integrated circuit of FIG. 1(*a*) after chemical mechanical polishing has been performed;

FIG. 1(*d*) is a more detailed close-up side view of the conductive layer shown in FIG. 1(*c*);

FIG. 2(*b*) is a side view of the conductive layer of FIG. 2(*a*);

FIG. 2(*c*) is a side view of the conductive layer of the integrated circuit of FIG. 2(*a*) after chemical mechanical polishing has been performed;

DETAILED DESCRIPTION

A novel method for increasing the uniformity of the metal lines on a conductive layer of an integrated circuit that is polished using chemical mechanical polishing is described in detail hereinafter.

Figure 1B:
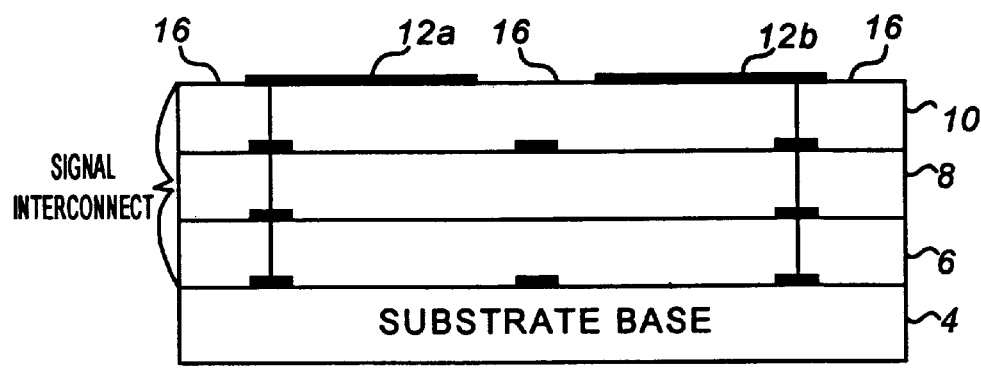
FIG. 1(*a*) is a top view of an example conductive layer of a prior art integrated circuit (IC)
Figure 1C:
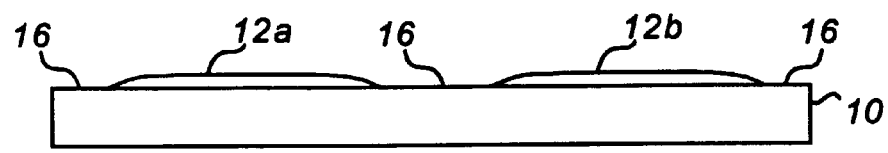
Figure 1D:
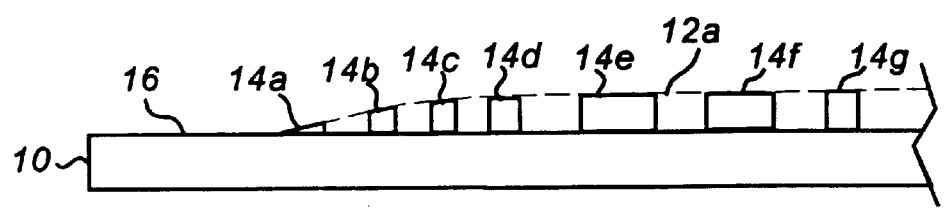

FIG. 1(*a*) illustrates a top view of an example conductive layer 10 of an integrated circuit (IC) 2. As illustrated, layer 10 comprises a plurality of functional blocks 12*a*, 12*b*, 12*c*, 12*d*, 12*e* and 12*f*. Functional blocks 12*a*, 12*b*, 12*c*, 12*d*, 12*e* and 12*f* each comprise a pattern of conductive lines (not shown) which implement the functionality of the respective block. The pattern and number of conductive lines may be identical or may vary from functional block to functional block. However, the conductive layer density within a given functional block does not range significantly from that of the other functional blocks. Functional blocks 12*a*, 12*b*, 12*c*, 12*d*, 12*e* and 12*f* are surrounded by empty space 16 used for routing channels implemented on lower layers. FIG. 1(*b*) is a side view of IC 2, illustrating the layered formation of the chip, including substrate base 4 and conductive layers 6, 8 and 10. Functional blocks 12*a* and 12*b* are visible from the view shown in FIG. 1(*b*). FIG. 1(*c*) is the same view as FIG. 1 (*b*) after chemical mechanical polishing has been performed on layer 10. As illustrated, functional blocks 12*a* and 12*b* are polished to a non-uniform thickness with the edge lines polished to a thinner thickness than the inner lines of each functional block. This is illustrated in further detail in FIG. 1 (*d*), which shows a portion of functional block 12*a*, including lines 14*a*, 14*b*, 14*c*, 14*d*, 14*e*, 14*f* and 14*g*. Lines 14*c*, 14*d*, 14*e*, 14*f* and 14*g* are polished at a uniform thickness because they reside in an approximately uniformly dense portion of the chip. However, edge lines 14*a* and 14*b* are polished to a progressively thinner thickness the closer they are to empty space 16 because empty space 16 contains no lines to balance out the pressure applied from the polishing platen. Accordingly, the significant difference in conductive layer density between inside functional block 12*a* and empty space 16 causes the outer edges of lines 14*a* and 14*b* to experience more pressure from the polishing platen than the inner lines 14*c*, . . . , 14*g*, and hence the outer lines 14*a* and 14*b* are worn down further during the polishing process.

Figure 2A:
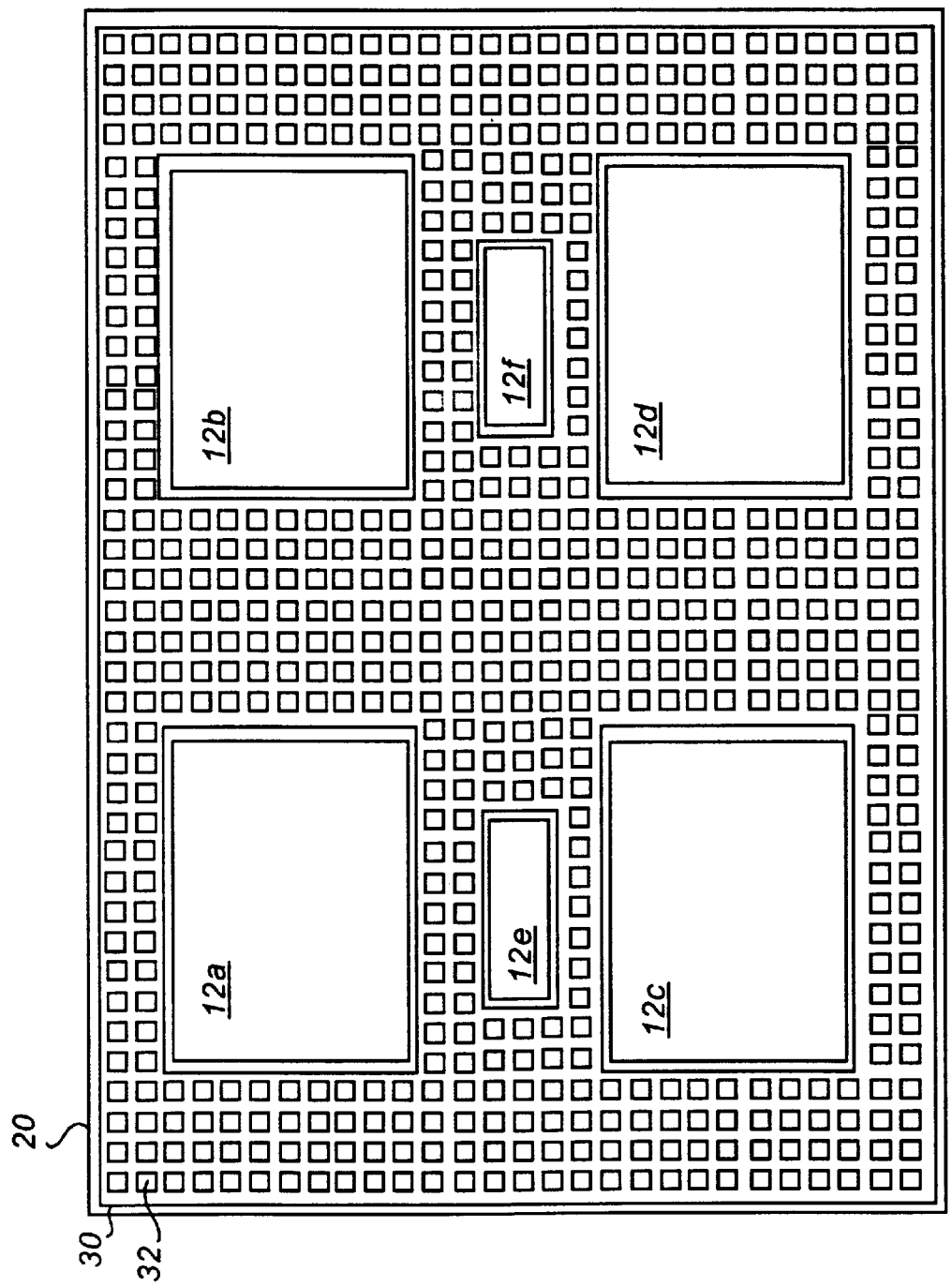
FIG. 2(*a*) is a top view of an example conductive layer of an integrated circuit (IC) implemented in accordance with the invention.

FIG. 2(a) is a top view of a conductive layer 20 implemented in accordance with the invention to solve this problem. As shown, layer 20 includes identical functional blocks 12a, . . . , 12f. However, in lower density areas such as empty spaces 16 between the functional blocks 12a, . . . , 12f, arrays 30 of capacitor cells are implemented to increase the uniformity of the density of the conductive layer.

The use of capacitor arrays 30 to fill in spaces 16 is additionally advantageous because they can be connected to provide additional bypass capacitance for reducing switching noise resulting from switching of complementary MOS inverters, IC bond wire inductance, and crosstalk between adjacent signals. Capacitor cells of a capacitor array may be used to reduce this noise by coupling one end of the capacitor cells to pads carrying a high power rail $V_{DD}$ and the other end to a low power rail $V_{SS}$.

This method provides the additional advantage that by tiling bypass capacitor cells between functional blocks, the space occupied by bypass capacitance blocks that in prior art was implemented as a separate functional block itself, is then freed for additional functionality.

Figure 2B:
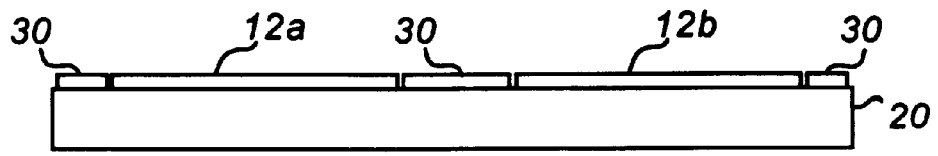
Figure 2C:
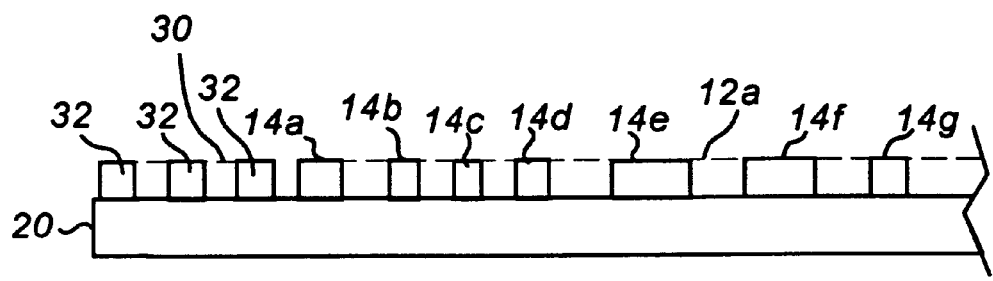

FIG. 2(b) is a side view of layer 20 after chemical mechanical polishing has been performed. As illustrated, functional blocks 12a and 12b, along with capacitor arrays 30 are polished to a uniform thickness across the layer 20. This is illustrated in further detail in FIG. 2(c), which shows a portion of functional block 12a, including lines 14a, 14b, 14c, 14d, 14e, 14f and 14g, and capacitor array 30. As in the prior art, lines 14c, 14d, 14e, 14f and 14g are polished at a uniform thickness because they reside in an approximately uniformly dense portion of the chip. In accordance with the invention, edge lines 14a and 14b are also polished at an approximately uniform thickness with inner functional block lines 14c, . . . , 14g due to their close proximity to the capacitor array 30. Accordingly, the capacitor array 30 balances out the pressure applied from the polishing platen. Thus, the outer edges of lines 14a and 14b experience approximately the same pressure from the polishing platen as the inner lines 14c, . . . , 14g, and hence are polished at a uniform rate during the polishing process.

Figure 3:
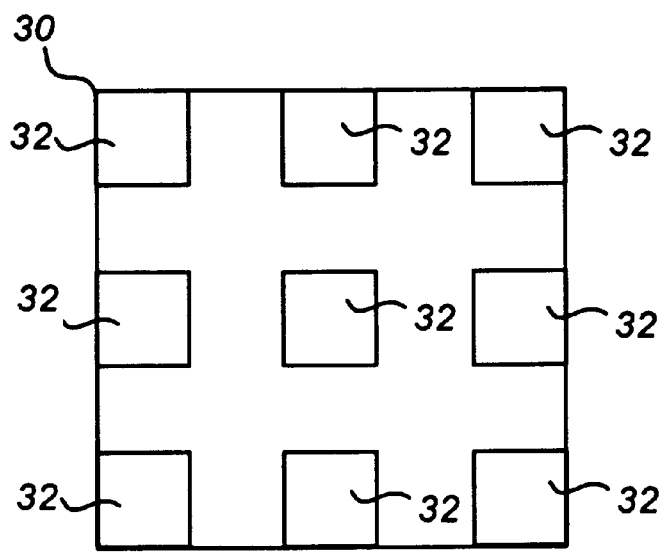
FIG. 3 is a top view of an example capacitor array for use in implementing the invention.

FIG. 3 is a top view of an example capacitor array 30. As illustrated, capacitor array 30 is tiled with grid of capacitor cells 32. Capacitor cells 32 are small enough that they can fit around irregularly shaped functional blocks on the chip, and can be tiled into any shape. Accordingly, a capacitor array 30 may range from a single capacitor cell 32 for a small space to fill, to any number of cells 32 for a large space to fill. Furthermore, capacitor cells 32 may be tiled in any arrangement so as to shape capacitor array 30 around the functional blocks. This is illustrated in FIG. 2(a) by the irregularly shaped capacitor arrays 30.

Figure 4:
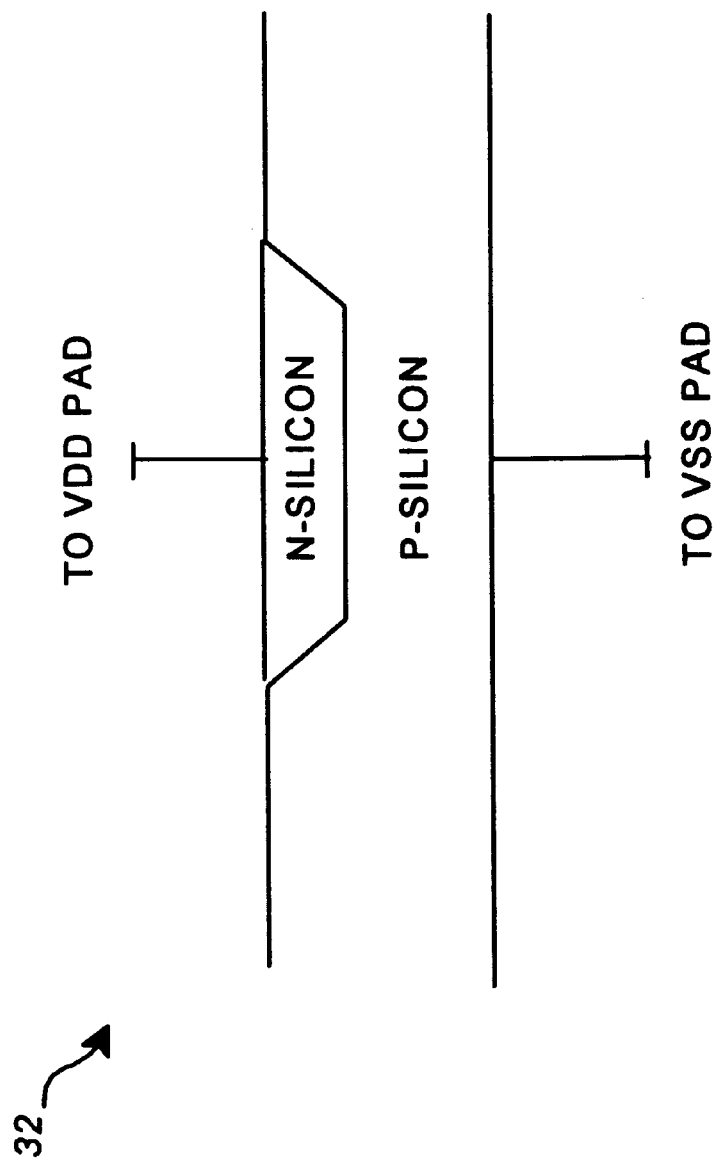
FIG. 4 is an illustrative embodiment of a capacitor cell used in implementing the invention.

In an illustrative embodiment shown in FIG. 4, capacitor cells 32 are each implemented as $p^-n^+$ junction capacitors with the $n^+$ metal coupled to the high power rail $V_{DD}$ and the $p^-$ metal coupled to the low power rail $V_{SS}$ The illustrative embodiment shown in FIG. 4 is presented herein by way of example and not limitation, and it is intended that other methods of forming capacitor cells that are well known in the art, such as forming a capacitor by coupling together the drain and source of a transistor, may be used in the formation of capacitor arrays 30 in the invention.

It will be appreciated from the above discussion that the invention provides several advantages in chip design technology over the prior art. First, it allows advanced wafer planarizing techniques such as chemical mechanical polishing to be employed in polishing semiconductor wafers without adversely impacting the uniform thickness of a given conductive layer. Second, the invention utilizes otherwise unused space to provide bypass capacitance for the integrated circuit to reduce switching noise, which may be used as additional bypass capacitance or may be used in place of dedicated bypass capacitance blocks that in the prior art would normally be implemented on a separate layer or in separate bypass capacitance functional blocks.

Although the invention has been described in terms of the illustrative embodiments, it will be appreciated by those skilled in the art that various changes and modifications may be made to the illustrative embodiments without departing from the spirit or scope of the invention. It is intended that the scope of the invention not be limited in any way to the illustrative embodiment shown and described but that the invention be limited only by the claims appended hereto.

What is claimed is:

1. An integrated circuit, comprising:

a semiconductor wafer;

a plurality of functional blocks implemented in said semiconductor wafer with space between said plurality of functional blocks;

a capacitor array comprising a plurality of capacitors cells implemented in said space between said plurality of functional blocks;

a conductive layer laminated over of said semiconductor wafer, said conductive layer comprising:

a plurality of functional block interconnect areas, with space therebetween, each of which comprises a plurality of intra-block conductive interconnects which connect components within said respective functional blocks, wherein each of said functional block interconnect areas is of approximately equal functional block conductor-to-nonconductor density defined by a ratio of said intra-block conductive interconnects to the area of said functional block interconnect area; and a plurality of capacitor array conductive interconnects laminated in said space between said functional block interconnect areas, so as to provide approximate uniformity in an overall conductor-to-nonconductor density across said conductive layer, wherein said overall conductor-to-nonconductor density is defined by a ratio of said functional block conductive interconnects and said capacitor array conductive interconnects to the area of the conductive layer.

2. An integrated circuit in accordance with claim 1, wherein:

each of said plurality of capacitor array conductive interconnects connects at least one of said capacitor cells in said capacitor array to either a power source or a ground source.

3. A method for increasing conductor-to-non-conductor density uniformity across a conductive layer of an integrated circuit, said integrated circuit comprising a semiconductor wafer, a plurality of functional blocks implemented in said semiconductor wafer with space between said plurality of functional blocks, and conductive layer laminated over said plurality of functional blocks, said conductive layer comprising a plurality of functional block interconnect areas with space between said plurality of functional block interconnect areas, each of said interconnect areas comprising a plurality of intra-block conductive interconnects which connect components within said respective functional blocks, wherein each of said functional block interconnect areas is of approximately equal functional block conductor-to-nonconductor density defined by a ratio of said intra-block conductive interconnects to the area of said functional block interconnect area, said method comprising:

implementing a plurality of capacitors in said space between said plurality of functional blocks in said semiconductor wafer laminating a plurality of capacitor array interconnects in said space between said functional block interconnect areas in said conductive layer, so as to provide approximate uniformity in an overall conductor-to-non-conductor density across said conductive layer, wherein said overall conductor-to-non-conductor density is defined by a ratio of said functional block conductive interconnects and said capacitor conductive interconnects to the area of the conductive layer.

4. A method in accordance with claim 3, comprising:

polishing said conductive layer.

\* \* \* \* \*